(12) United States Patent
Ren et al.

(10) Patent No.: US 11,942,303 B2
(45) Date of Patent: Mar. 26, 2024

(54) SYSTEMS AND METHODS FOR REAL TIME STEREO IMAGING USING MULTIPLE ELECTRON BEAMS

(71) Applicant: ASML Netherlands B.V., Veldhoven (NL)

(72) Inventors: Yan Ren, Eindhoven (NL); Albertus Victor Gerardus Mangnus, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 339 days.

(21) Appl. No.: 17/359,365

(22) PCT Filed: Dec. 6, 2019

(86) PCT No.: PCT/EP2019/083982
§ 371 (c)(1),
(2) Date: Jun. 25, 2021

(87) PCT Pub. No.: WO2020/141041
PCT Pub. Date: Jul. 9, 2020

(65) Prior Publication Data
US 2023/0154723 A1    May 18, 2023

Related U.S. Application Data

(60) Provisional application No. 62/787,098, filed on Dec. 31, 2018.

(51) Int. Cl.
*H01J 37/147* (2006.01)
*G01N 23/2251* (2018.01)
(Continued)

(52) U.S. Cl.
CPC ...... *H01J 37/1478* (2013.01); *G01N 23/2251* (2013.01); *H01J 37/09* (2013.01);
(Continued)

(58) Field of Classification Search
CPC ........ H01J 37/00; H01J 37/1478; H01J 37/02; H01J 37/09; H01J 37/145; H01J 37/1474;
(Continued)

(56) References Cited

U.S. PATENT DOCUMENTS

| 4,983,832 A | 1/1991 | Sato |
| 2005/0263715 A1* | 12/2005 | Nakasuji ............... H01J 37/141 250/311 |

(Continued)

FOREIGN PATENT DOCUMENTS

| EP | 2816585 A1 | 12/2014 |
| JP | 2009/134926 A | 6/2009 |

(Continued)

OTHER PUBLICATIONS

International Search Report and Written Opinion issued by the International Searching Authority issued in related International Application No. PCT/EP2019/083982, dated Mar. 17, 2020 (3 pgs.).

(Continued)

*Primary Examiner* — Jason L McCormack
(74) *Attorney, Agent, or Firm* — FINNEGAN, HENDERSON, FARABOW, GARRETT & DUNNER LLP (57) ABSTRACT

Embodiments consistent with the disclosure herein include methods and a multi-beam apparatus configured to emit charged-particle beams for imaging a top and side of a structure of a sample, including: a deflector array including a first deflector and configured to receive a first charged-particle beam and a second charged-particle beam; a blocking plate configured to block one of the first charged-particle beam and the second charged-particle beam; and a controller having circuitry and configured to change the configuration of the apparatus to transition between a first mode and a second mode. In the first mode, the deflector array directs the (Continued)

second charged-particle beam to the top of the structure, and the blocking plate blocks the first charged-particle beam. And in the second mode, the first deflector deflects the first charged-particle beam to the side of the structure, and the blocking plate blocks the second charged-particle beam.

14 Claims, 7 Drawing Sheets

(51) Int. Cl.
*H01J 37/09* (2006.01)
*H01J 37/145* (2006.01)
*H01J 37/20* (2006.01)
*H01J 37/28* (2006.01)

(52) U.S. Cl.
CPC ........ *H01J 37/145* (2013.01); *H01J 37/1474* (2013.01); *H01J 37/20* (2013.01); *H01J 37/28* (2013.01); *G01N 2223/07* (2013.01); *G01N 2223/418* (2013.01); *G01N 2223/507* (2013.01); *H01J 2237/0455* (2013.01); *H01J 2237/04926* (2013.01); *H01J 2237/103* (2013.01); *H01J 2237/151* (2013.01); *H01J 2237/226* (2013.01); *H01J 2237/2611* (2013.01)

(58) Field of Classification Search
CPC .. H01J 37/20; H01J 37/26; H01J 37/28; H01J 37/12; H01J 37/1471; H01J 2237/0455; H01J 2237/04926; H01J 2237/103; H01J 2237/151; H01J 2237/226; H01J 2237/2611; G01N 23/2251; G01N 2223/07; G01N 2223/418; G01N 2223/507
USPC .............................. 250/306, 307, 311, 492.2
See application file for complete search history.

(56) References Cited

U.S. PATENT DOCUMENTS

| 2014/0367586 | A1* | 12/2014 | Frosien | H01J 37/153 250/397 |
| 2015/0060662 | A1* | 3/2015 | Chen | H01J 37/141 250/307 |
| 2016/0172150 | A1* | 6/2016 | Li | H01J 37/145 250/396 ML |
| 2017/0082425 | A1* | 3/2017 | Minekawa | G01N 21/956 |
| 2017/0263413 | A1 | 9/2017 | Frosien | |

FOREIGN PATENT DOCUMENTS

| TW | 201515044 A | 4/2015 |
| WO | WO 2018/160688 A1 | 9/2018 |

OTHER PUBLICATIONS

Office Action issued by the Intellectual Property Office (IPO) in related ROC (Taiwan) Application No. 108145651, dated Nov. 30, 2020 (11 pgs.).

Ushiki, Tatsuo, et al.; "Development of SEM for Realtime 3D Imaging and Its Applications in Biology"; Hitachi Review vol. 65 (2016), No. 7 (pp. 218-224).

* cited by examiner

SYSTEMS AND METHODS FOR REAL TIME STEREO IMAGING USING MULTIPLE ELECTRON BEAMS

CROSS-REFERENCE TO RELATED APPLICATIONS

This application claims priority to International Application No. PCT/EP2019/083982, filed Dec. 6, 2019, and published as WO 2020/141041 A1, which claims priority of U.S. application 62/787,098 which was filed on Dec. 31, 2018. The contents of these applications are incorporated herein by reference in their entireties.

TECHNICAL FIELD

The embodiments provided herein disclose a charged-particle beam inspection system, and more particularly systems and methods of real-time stereo imaging of structures of a sample using multiple charged-particle beams.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. IC components are manufactured by placing multiple layers onto one another to build the IC. Accordingly, it is necessary to be able to inspect the three-dimensional structure of the IC components as they are manufactured for defects.

Moving stages that secure the IC chip in place can be used to allow a charged-particle beam to capture images of different sides of structures of an IC chip, but these methods are slow and prone to error. Some related art systems adjust a single beam to attempt to inspect sides of structures of the IC chip, but these systems that use a single beam suffer from aberrations from manipulation of the charged-particle beam particularly when trying to image IC components at larger angles that provide better inspection images.

Accordingly, methods and systems for creating large-angle, stereo or three-dimensional inspection images of IC chips in real time are desired.

SUMMARY

Embodiments consistent with the disclosure herein include methods and a multi-beam apparatus configured to emit multiple charged-particle beams for imaging a top of and a side of a structure of a sample, the apparatus including: a deflector array including a first deflector and configured to receive a first charged-particle beam and a second charged-particle beam; a blocking plate configured to block one of the first charged-particle beam and the second charged-particle beam; and a controller having circuitry and configured to change the configuration of the apparatus to transition between a first mode and a second mode. The first mode and the second mode can be configured wherein: in the first mode, the deflector array is configured to direct the second charged-particle beam to image the top of the structure, and the blocking plate is configured to block the first charged-particle beam; and in the second mode, the first deflector is configured to deflect the first charged-particle beam to image the side of the structure, and the blocking plate is configured to block the second charged-particle beam.

In another embodiment the methods and apparatus include an objective lens that can be an electrostatic lens, a magnetic lens, or a combination of both. In some embodiments, the objective lens is a moveable objective lens.

In yet additional embodiments, the methods and apparatus include a condenser lens that can be an electrostatic lens, a magnetic lens, or a combination of both. The condenser lens can be movable and rotatable to axially align with any of the at least three charged-particle beams.

In some embodiments, the first charged-particle beam and second charged-particle beam are focused using separate objective lenses and in some embodiments the apparatus of the first charged-particle beam and second charged-particle beam are focused using separate condenser lenses In yet another embodiment the methods and apparatus include a deflector array that includes a second deflector configured to deflect the second charged-particle beam into the blocking plate when operating the first mode. In some embodiments, the deflector array is configured to receive a third charged-particle beam and includes a third deflector configured to deflect the third charged-particle beam into the blocking plate when operating in either the first or second modes.

In yet another embodiment of the methods and apparatus, The controller is configured to change the configuration of the apparatus to transitions between the first mode, the second mode, and a third mode, wherein in the third mode, the third deflector is configured to direct the third charged-particle beam to image a side different from the side of the structure, and the blocking plate is configured to block the first and second charged-particle beams.

In yet additional embodiments of the methods and apparatus, the controller is further configured to acquire an image from each portion of the structure and combine the acquired images into a stereo image of the structure.

Embodiments consistent with the present disclosure further include a scanning electron microscope (SEM) system, comprising: a charged particle source for providing charged particles to enable a plurality of beamlets, a first beamlet being an axial beam configured to perpendicularly impact a structure of a sample; a plurality of deflectors, wherein a subset of the deflectors are configured to deflect a subset of the beamlets to cause each of the subset of beamlets to impact the structure at a tilt relative to the axial beam; and a plurality of condensers, wherein each of a subset of the condensers has an axis tilted to coincide with a path of one of the subset of beamlets.

In some embodiments the SEM system, further comprises a Moving Objective Lens (MOL) that can be configured to shift the focusing field of the objective lens. In some embodiments, the MOL is configured to shift the focusing field of the objective lens to coincide, at different times, with each of the beamlets.

In yet another embodiment, the SEM system includes an objective lens that is one of an electrostatic lens, a magnetic lens, or both. In some embodiments, each of the condensers of the SEM system is an electrostatic lens, a magnetic lens, or both.

In yet another embodiment, the SEM system further comprises a controller having circuitry and configured to process images based on the plurality of beamlets to enable a real time display of a three-dimensional representation of the structure.

In some embodiments of the SEM system, each of the subset of deflectors is configured to deflect a different beamlet of the subset of beamlets to cause each beamlet of the subset of beamlets to impact the structure at a different tilt relative to the axial beam.

In yet another embodiment, the SEM system further includes a blocking mechanism configured to prevent all but one of the beamlets from impacting the structure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools (such as, a SEM) may be essential for maintaining high yields and low cost. Moreover, as IC chips are manufactured, multiple layers are placed on top of each other during the manufacturing process. Accordingly, it is also important to be able to inspect the three-dimensional structure of the IC chip in an efficient manner to that can maintain high process yields and high wafer throughput.

In a charged-particle beam imaging or inspection system, such as, for example, a SEM, the charged-particle beam may be focused on the wafer to produce an image of the layout for the IC chip. As more and more layers are deposited onto the IC chip, charged-particle beams focused on the sides of structures of the IC chip can provide a three-dimensional view of the components on the IC chip for inspection. To accomplish this, the charged-particle beam can be directed at the IC chip at an angle that is relative to a line perpendicular to the surface of the chip.

But directing a charged-particle at such an angle can be accomplished in different ways. Some methods use a single charged-particle beam and rotate the stage that holds the IC chip so that the beam can image side walls of structures of the IC chip as the stage rotates. However, this method is slow and requires complex mechanical movement and adjustment of the stage which prevents the use of this method for real-time inspection. Other systems include deflecting a single-charged particle beam to illuminate the sides of structures an IC chip. But these methods only work for small inspection angles and provide significantly degraded results as the inspection angle increases. None of the present systems provide for real time stereo or three-dimensional imaging while also providing effective imaging resolution at larger imaging angles (e.g., over 30).

To meet the need for high resolution, three-dimensional imaging at larger imaging angles and in real-time, the charged-particle beam system can utilize multiple particle beams for imaging the different parts of the IC chip. For example, different charged-particle beams can be used to image the top, left, right, front, and back of the IC chip or structures on the IC chip. Images for these various portions of the IC chip can be taken rapidly in sequence and combined to create the three-dimensional image. Because of the speed at which the system can take and combine the different images, the system can still operate in real time for the purposes of IC chip inspection even when imaging each surface of the IC chip sequentially. By operating in real time, the feedback produced by the inspection system can be captured and processed without slowing the manufacturing process and reducing wafer throughput.

Figure 3A:
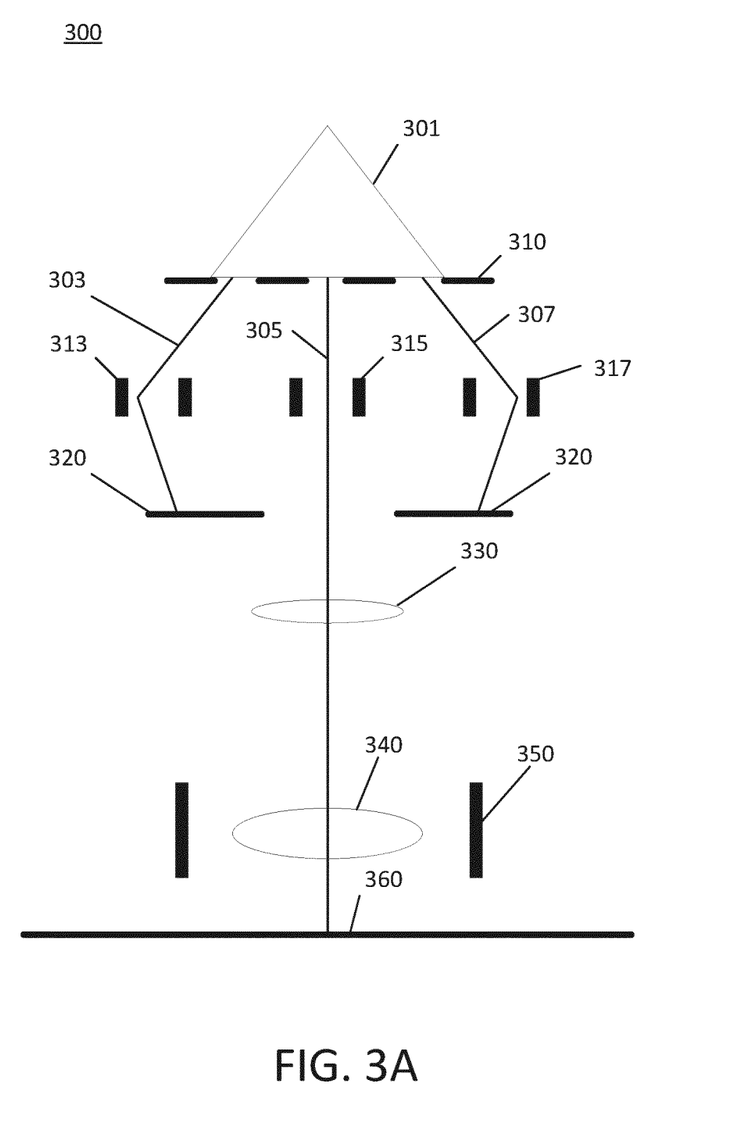
FIGS. 3A-3C are schematic diagrams illustrating an exemplary electron beam tool that can be a part of the exemplary electron beam inspection system of FIG. 1, consistent with embodiments of the present disclosure.

A first charged-particle beam can be emitted directly toward the IC chip as shown in FIG. 3A by electron beam 305. This particle beam can pass through a condenser lens and through an optical lens that focuses the charged particle beam on the top of the chip providing a top-down view of the IC chip. Additional charged-particle beams can be emitted by the inspection tool. These beams can be initially angled away from the IC chip as shown by the electron beams 303 and 307 in FIGS. 3A-3C. Deflectors can then deflect the charged-particle beams back toward the IC chip. The charged-particle beams can pass through both a condenser lens and an objective lens that focus the charged-particle beam onto a side of structures of the IC chip as shown in FIGS. 3B and 3C.

Figure 3B:
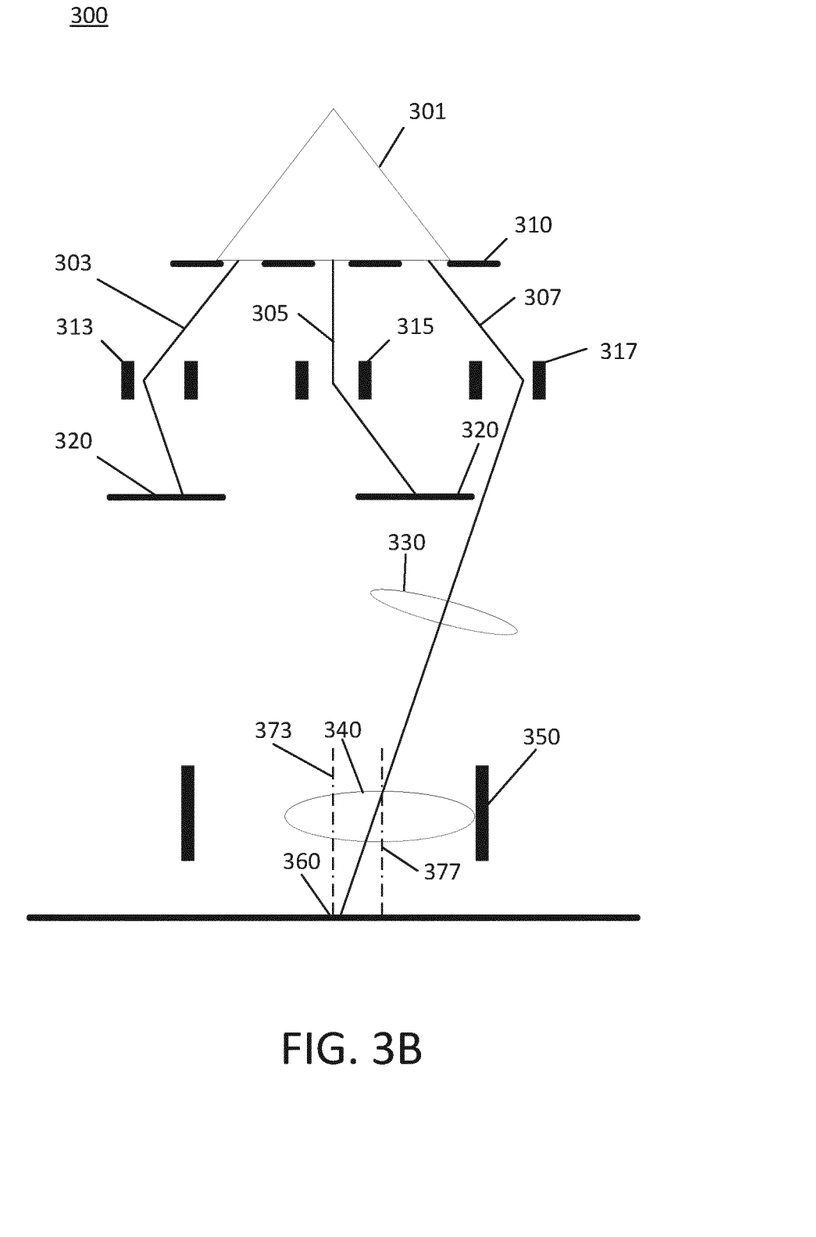
Figure 3C:
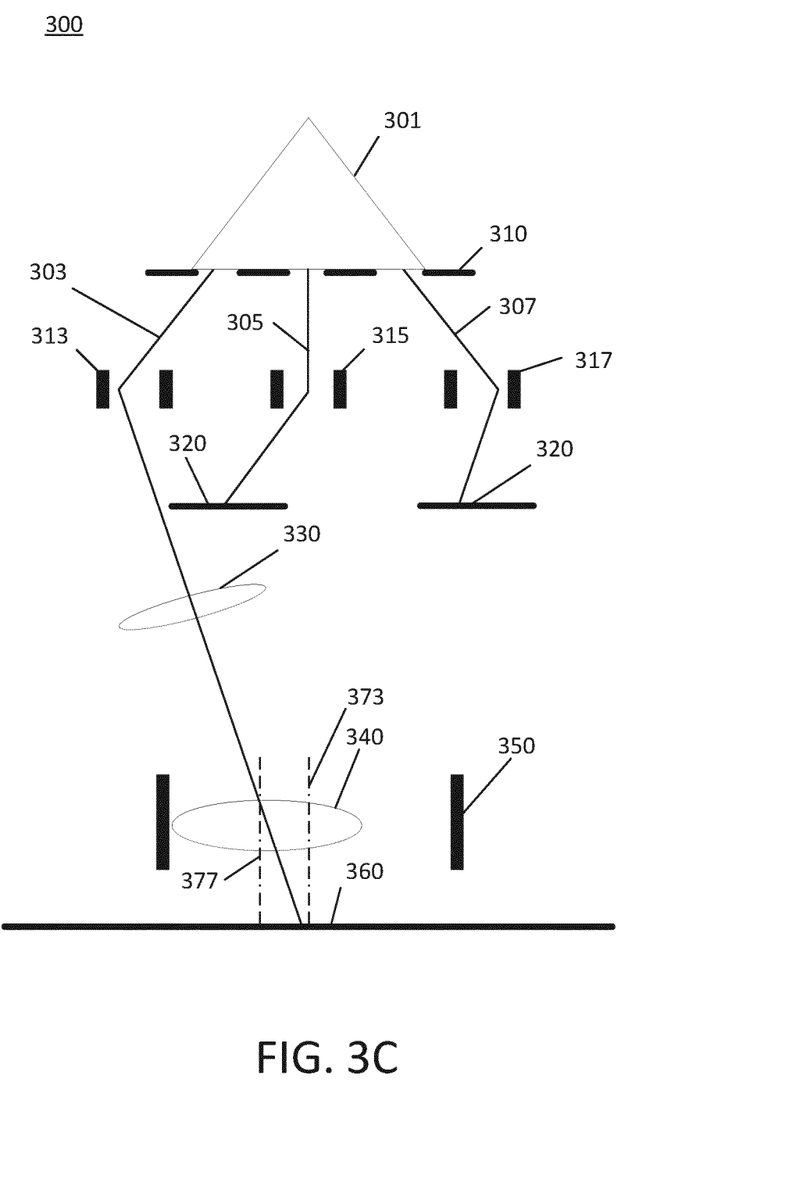

The condenser lens can be moved and rotated to align axially with the charged-particle beam it is focusing, as shown in FIGS. 3A-3C. This alignment eliminates the introduction of off-axis aberration from the condenser lens. In some instances, instead of moving, the condenser lens can include separate lenses—one for each charged-particle beam that is oriented to axially align with that particular beam, using, for example, the lens structure shown in FIG. 4. The objective lens can also move side to side so that the center of the objective lens can align with the charged-particle it is focusing. By aligning the center of the objective lens with the charged-particle beam, inspection system can reduce the amount of off-axis aberration introduced by the objective lens. As with the condenser lens, in some instances multiple objective lenses can be used with each one being axially aligned with one of the charged-particle beams to prevent off-axis aberration.

Because multiple charged-particle beams illuminating the IC chip at the same time would distort the acquired image, a blocking plate and deflectors can be used to block all but one of the charged-particle beams at any point in time. In this way, an inspection tool can use a sequence of configurations (e.g., a sequence of each of the configurations shown in FIGS. 3A, 3B, and 3C) to capture sequential images of the IC chip. After capturing the first image, the inspection tool can adjust the configuration to capture the next image. This process can continue until the inspection tool has captured all the necessary images for creating the three-dimensional image of the IC chip. For the example configuration shown in FIGS. 3A-3C, the inspection tool can sequentially capture three images of the IC chip—one image of the top of the IC chip and an image of each of two opposite sides of structures of the IC chip. These images can then be combined to create the three-dimensional image of the IC chip.

The inspection tool can utilize electrostatic or magnetic condenser and objective lenses to focus the electron beam. Additionally, separate lenses can be used to eliminate the time necessary to move and position the lenses each time a different charged-particle beam is used for imaging. The response time of the deflectors and the lenses are fast enough that the sequence of images needed for the inspection of the IC chip can be captured in real time in order to maintain high wafer throughput.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Figure 1:
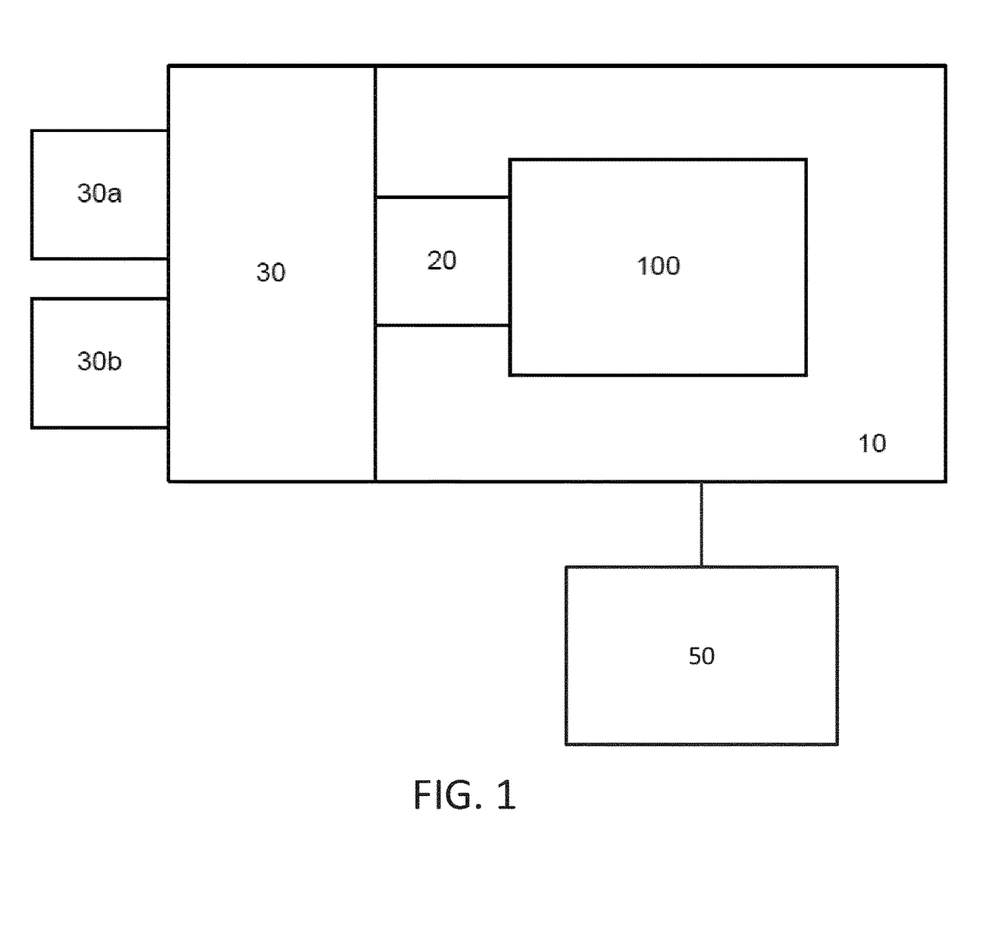
FIG. 1 is a schematic diagram illustrating an exemplary electron beam inspection (EBI) system, consistent with embodiments of the present disclosure.

Reference is now made to FIG. 1, which illustrates an exemplary electron beam inspection system consistent with embodiments of the present disclosure. Although the present disclosure refers to an electron beam inspection system, it is understood that the present disclosure can apply more generally to charged-particle beam inspection systems and the use description of electron beams is exemplary. In some embodiments, electron beam inspection system is an electron beam inspection (EBI) system 100. In some embodiments, electron beam inspection as shown in FIG. 1, electron beam inspection system 1 includes a main chamber 10, a load/lock chamber 20, a charged-particle beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (a sample can be a wafer or other component, or can be a portion of the wafer or the other component, and the terms sample and wafer can both refer to a same component, can refer to different portions of a same component, or can refer to different components). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100. While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

A controller 50 is electronically connected to electron beam tool 100. Controller 50 may be a computer configured to execute various controls of the electron beam inspection system. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. While the present disclosure provides examples of main chamber 10 housing an electron beam inspection tool 100, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
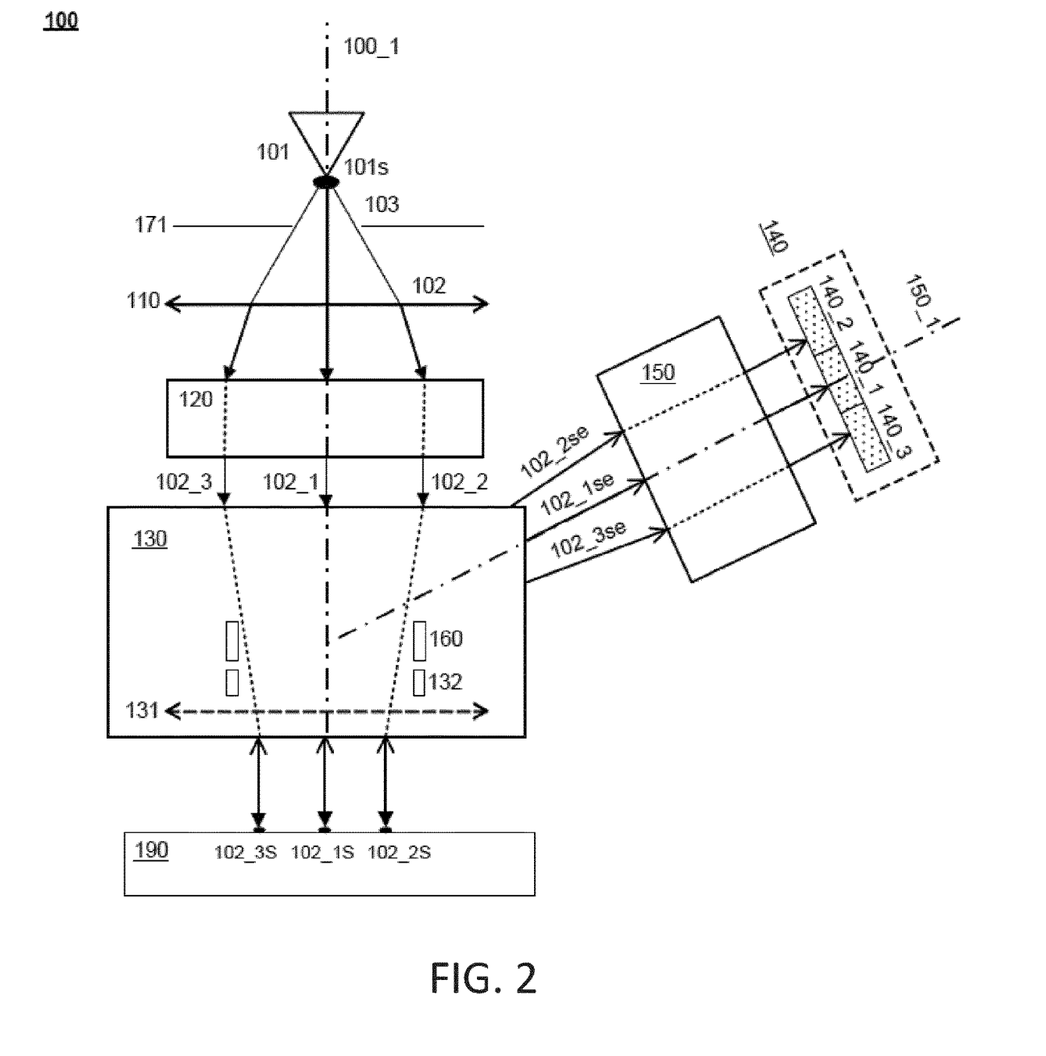
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool or, in some embodiments, an electron-beam tool, that can be a part of the exemplary electron beam inspection system 1 of FIG. 1, consistent with embodiments of the present disclosure. Electron beam tool 100 (also referred to herein as apparatus 100) comprises an electron beam source 101, a gun aperture plate 171 with a gun aperture 103, a condenser lens 110, a source conversion unit 120, a primary projection optical system 130, a sample stage (not shown in FIG. 2), a secondary optical system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 100 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary optical system 150 and electron detection device 140 can be aligned with a secondary optical axis 150_1 of apparatus 100.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 can comprise an image-forming element array (not shown in FIG. 2). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets. Controller 50 of FIG. 1 may be connected to various parts of charged particle beam inspection system 100 of FIG. 1, such as source conversion unit 120, electron detection device 140, primary projection optical system 130, or a motorized stage (not shown). In some embodiments, as explained in further details below, controller 50 may perform various image and signal processing functions. Controller 50 may also generate various control signals to govern operations of the charged particle beam inspection system.

Condenser lens 110 can focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. Objective lens 131 can focus beamlets 102_1, 102_2, and 102_3 onto a sample 190 for inspection and can form three probe spots 102_1s, 102_2s, and 102_3s on surface of sample 190. Gun aperture plate 171 can block off peripheral electrons of primary electron beam 102 not in use to reduce Coulomb effect. The Coulomb effect can enlarge the size of each of probe spots 102_1s, 102_2s, and 102_3s, and therefore deteriorate inspection resolution.

Beam separator 160 can be a beam separator of Wien filter type comprising an electrostatic deflector generating an electrostatic dipole field μl and a magnetic dipole field B1 (both of which are not shown in FIG. 2). If they are applied, the force exerted by electrostatic dipole field μl on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 190. In response to incidence of beamlets 102_1, 102_2, and 102_3 at probe spots 102_1s, 102_2s, and 102_3s, three secondary electron beams 102_1se, 102_2se, and 102_3se can be emitted from sample 190. Each of secondary electron beams 102_1se, 102_2se, and 102_3se can comprise secondary electron beams with a distribution of energies including secondary electrons (energies ≤50 eV) and backscattered electrons (energies between 50 eV and landing energies of beamlets 102_1, 102_2, and 102_3).

Beam separator 160 can direct secondary charged-particle beams 102_1se, 102_2se, and 102_3se towards secondary optical system 150. Secondary optical system 150 can focus secondary electron beams 102_1se, 102_2se, and 102_3se onto detection elements 140_1, 140_2, and 140_3 of electron detection device 140. Detection elements 140_1, 140_2, and 140_3 can detect corresponding secondary electron beams 102_1se, 102_2se, and 102_3se and generate corresponding signals, which are sent to controller 50 or a signal processing system (not shown), e.g. to construct images of the corresponding scanned areas of sample 190.

In some embodiments, detection elements 140_1, 140_2, and 140_3 detect corresponding secondary electron beams 102_1se, 102_2se, and 102_3se, respectively, and generate corresponding intensity signal outputs (not shown) to an image processing system (e.g., controller 50). In some embodiments, each detection element 140_1, 140_2, and 140_3 may comprise one or more pixels. The intensity signal output of a detection element may be a sum of signals generated by all the pixels within the detection element.

In some embodiments, controller 50 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 190. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 140. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 190. The acquired images may comprise multiple images of a single imaging area of sample 190 sampled multiple times over a time sequence. The multiple images may be stored in the storage. In some embodiments, controller 50 may be configured to perform image processing steps with the multiple images of the same location of sample 190.

In some embodiments, controller 50 may include measurement circuitries (e.g., analog-to-digital converters) to obtain a distribution of the detected secondary electrons. The electron distribution data collected during a detection time window, in combination with corresponding scan path data of primary electron beam 102 incident on the wafer surface, can be used to reconstruct images of the wafer structures under inspection. The reconstructed images can be used to reveal various features of the internal or external structures of sample 190, and thereby can be used to reveal any defects that may exist in the wafer.

Reference is now made to FIGS. 3A-3C, which are schematic diagrams of an exemplary electron beam tool 300 that can use multiple charged-particle beams for stereo or three-dimensional imaging of a sample, e.g. a wafer. Each of FIGS. 3A, 3B, and 3C show electron beam tool in a different state. In some embodiments, electron beam tool 300 can be EBI tool 100 of FIG. 2. Electron beam tool 300 includes electron source 301 that can emit electron beams 303, 305, and 307. Electron beams can pass through aperture array 310 that focuses the beams toward deflectors 313, 315, and 317. In some embodiments, electron beam source 301 can emit a single electron beam and further include a deflector to deflect the single electron beam along the path shown by electron beams 303, 305, and 307.

Deflectors 313, 315, and 317 can direct electron beams in different directions. In some embodiments any of deflectors 313, 315, and 317 can direct a corresponding electron beam (e.g., electron beam 303, 305, or 307) into blocking plate 320. Blocking plate 320 can block one or more of the electron beams 303, 305, and 307. In some embodiments, blocking plate 320 is moveable (e.g., via controller 50 of FIG. 1) and can be moved to block different electron beams 303, 305, and 307 at different times. In some embodiments, blocking plate 320 is designed so that only one of electron beam 303, 305, and 307 can be unblocked at a time.

Electron beam tool 300 can further include condenser lens 330. Condenser lens 330 can be condenser lens 110 of FIG. 2. Condenser lens 330 can focus any of electron beams 303, 305, and 307. As shown in FIGS. 3A, 3B, and 3C, condenser lens 330 can move from side to side and can rotate to properly align with any of electron beams 303, 305, and 307 that are not blocked by blocking plate 320. In some embodiments, condenser lens 330 can include multiple condenser lenses. In these embodiments, each electron beam (e.g., electron beam 303, 305, and 307) uses a separate, fixed-position condenser lens. For example, this structure is shown in FIG. 4.

In some embodiments, the central beam 305 that passes through condenser lens 330 of FIG. 3A is an axial beam that is manipulated, such as by electron source 301 or deflector 315, to impact sample 360 substantially perpendicularly. The left beam 303 that passes through left condenser lens 330 of FIG. 3C and the right beam 307 that passes through condenser lens 330 of FIG. 3B are manipulated or deflected, such as by electron source 301 or deflectors 313 or 317, to cause the beams to impact sample 360 at a tilt relative to the axial beam. In some embodiments, the tilt is equal to or greater than three degrees relative to the axial beam, to enable improved imaging of the side walls of a structure on sample 360. In other embodiments, the tilt is equal to or greater than five degrees relative to the axial beam, also to enable improved imaging of the side walls of a structure on sample 360. Further, in some embodiments a subset of the condenser lenses are tilted relative to the axial beam to coincide with a corresponding one of the tilted beamlets. For example, the left condenser lens 330 is tilted to coincide with the path of left beam 330 of FIG. 3C and the right condenser lens 330 is tilted to coincide with the path of right beam 330 of FIG. 3B.

Figure 4:
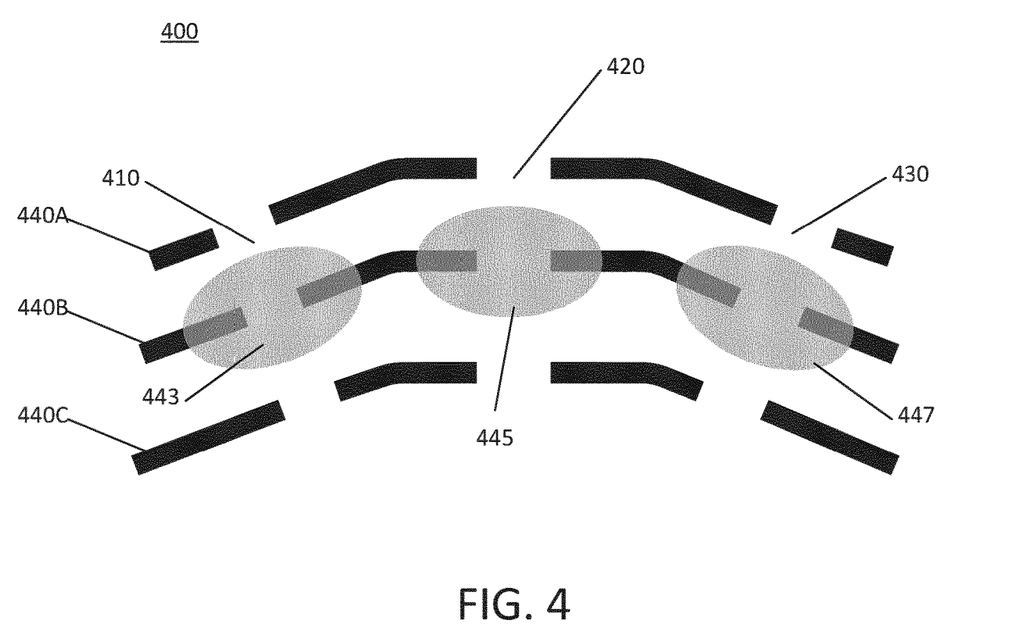
FIG. 4 illustrates a cross-section view of an exemplary lens structure of a charged-particle beam system, consistent with embodiments of the present disclosure.

FIG. 4 is a schematic diagram of an exemplary lens 400. Lens 400 can be a magnetic lens, electrostatic lens, or a combination of the two. Lens 400 can use deflectors lens elements 440A-440C to direct an electron beam. Lens 400 can be used as, for example, condenser lens 330 of FIGS. 3A-3C and objective lens 340 of FIGS. 3A-3C and described in more detail below. Lens 400 can include channels 410, 420, and 430, through which an electron beam (e.g., electron beam 303, 305, or 307) can pass. As the electron beam passes through one of channels 410, 420, and 430, lens elements 440A-440C can focus the electron beam. The lens elements can create a lens structure or effect like that shown as effective lenses 443, 445, and 447. The structure of lens 400 can be used for condenser lens 330, describe above in relation to FIGS. 3A-3C, and can be used for objective lens 340, described in more detail below in relation to FIGS. 3A-3C.

Referring back to FIGS. 3A-3C, electron beams 303, 305, and 307 can pass through condenser lens 330 to objective lens 340. Objective lens 340 can focus any of electron beams 303, 305, and 307 on the sample 360 on a wafer. In some embodiments, electron beam tool 300 can include deflectors 350 to correct off-axis aberrations that can occur from electron beams 303, 305, and 307 not being axially aligned with objective lens 340. Deflectors 350 can be magnetic deflectors, electrostatic deflectors, or a combination of both technologies. Deflectors 350 can shift the focusing field of objective lens 340 (e.g., using Moving Objective Lens ("MOL") technology). Accordingly, objective lens 340 is moveable, and moving the objective lens ensures that each electron beam goes through the center of objective lens 340 (as shown through each of FIGS. 3A-3C), leading to smaller aberrations even for large tilting angles.

In some embodiments, objective lens 340 can be multiple objective lenses. In these embodiments, each of the objective lenses of objective lens 340 can be axially aligned with one of electron beams 303, 305, and 307, thereby minimizing off-axis aberrations from being introduced. As described above, objective lens 340 can use the structure of lens 400 described in reference to FIG. 4 above. After being focused by objective lens 340, electron beams 303, 305, and 307 can illuminate sample 360 on the wafer, which can allow electron beam tool 300 to generate an image of the sample.

As described above, FIGS. 3A-3C illustrate exemplary electron beam tool 300. Although FIGS. 3A-3C illustrate the same components, each can demonstrate a particular configuration of electron beam tool 300 and each configuration is described in more detail below. During operation, only one configuration, (e.g., a configuration shown in FIG. 3A, 3B, or 3C) can be active at a time. Electron beam tool 300 can move through the configurations shown in FIGS. 3A-3C sequentially to allow imaging of the top and sides of structures of sample 360 on the wafer. It is appreciated that a specific sequence of configurations is not necessary, only that each of the configurations occur in the sequence to allow electron beam tool 300 to generate a stereo or three-dimensional image of sample 360.

Reference is now made to FIG. 3A, which is an exemplary configuration of electron beam tool 300. In the configuration shown in FIG. 3A, electron beam tool 300 can image the top of sample 360 on a wafer. In the configuration of FIG. 3A, blocking plate 320 can be positioned to block electron beams 303 and 307. Deflectors 313 and 317 can also direct or deflect electron beams 303 and 307, respectively, into blocking plate 320. As used herein, directing an electron beam can mean making minor changes to the path of an electron beam. In some embodiments deflecting an electron beam can mean causing a larger change in the direction of an electron beam. Moreover, directing an electron beam can be the same as deflecting an electron beam. Electron beam 305 can pass through deflector 315 that can direct electron beam 305 past blocking plate 320 to condenser 330. Condenser 330 can focus electron beam 305 through objective lens 340. As described above, condenser 330, objective lens 340, and deflectors 350 can work in conjunction (e.g., via controller 50 of FIG. 1) to direct electron beam 305 to sample 360 on the wafer. In this configuration, electron beam 305 can intersect the top of sample 360, producing an image of the top of sample 360.

Reference is now made to FIG. 3B, which is an exemplary configuration of electron beam tool 300. In the configuration shown in FIG. 3B, electron beam tool 300 can image one side wall of structures of sample 360 on a wafer. In the configuration of FIG. 3B, blocking plate 320 can be positioned to block electron beams 303 and 305. Deflectors 313 and 315 can also direct electron beams 303 and 305, respectively, into blocking plate 320. Electron beam 307 can pass through deflector 317, that can direct electron beam 307 past blocking plate 320 to condenser 330. Condenser 330 can focus electron beam 307 through objective lens 340, which has been shifted to the right (e.g., to be centered on line 377) from its original location (e.g., centered on line 373) to allow beam 307 to go through the center of objective lens 340, thereby minimizing aberrations. As described above condenser 330, objective lens 340, and deflectors 350 can work in conjunction to direct electron beam 307 to sample wafer 360. In this configuration, electron beam 307 can intersect the side walls of structures of sample 360 producing an image of the side walls of the structures. The configuration shown in FIG. 3B can direct the electron beam at large angles that can provide increased resolution for the imaging of the side walls of structures of sample 360 while also limited aberration produced by the condenser lens 330 and objective lens 340.

Reference is now made to FIG. 3C, which is an exemplary configuration of electron beam tool 300. In the configuration shown in FIG. 3C, electron beam tool 300 can image a side wall of a structure of sample 360 on a wafer. In the configuration of FIG. 3C, blocking plate 320 can be positioned to block electron beams 305 and 307. Deflectors 315 and 317 can also direct electron beams 305 and 307, respectively, into blocking plate 320. Electron beam 303 can pass through deflector 313 that can direct electron beam 303 past blocking plate 320 to condenser 330. Condenser 330 can focus electron beam 303 through objective lens 340, which has been shifted to the left (e.g., to be centered on line 377) from its original location (e.g., centered on line 373) to allow beam 303 to go through the center of objective lens 340, thereby minimizing aberrations. As described above condenser 330, objective lens 340, and deflectors 350 can work in conjunction to direct electron beam 303 to sample wafer 360. In this configuration, electron beam 303 can intersect the side walls of structures of sample wafer 360, producing an image of the side walls of the structures. The configuration shown in FIG. 3B can direct the electron beam at large angles that can provide increased resolution for the imaging of the side walls of structures of sample 360, while also limiting aberration produced by the condenser lens 330 and objective lens 340. Moreover, the configuration shown in FIG. 3C can produce an image of the opposite side of that shown in the configuration of FIG. 3B.

Electron beam tool 300, using the three configurations shown in reference to FIGS. 3A-3C can, in sequence, produce images of the top and two sides of structures of sample 360. Using these images, EBI system 100 can construct a stereo or three-dimensional image of sample 360 that can show the three-dimensional structure of sample 360.

Figure 5:
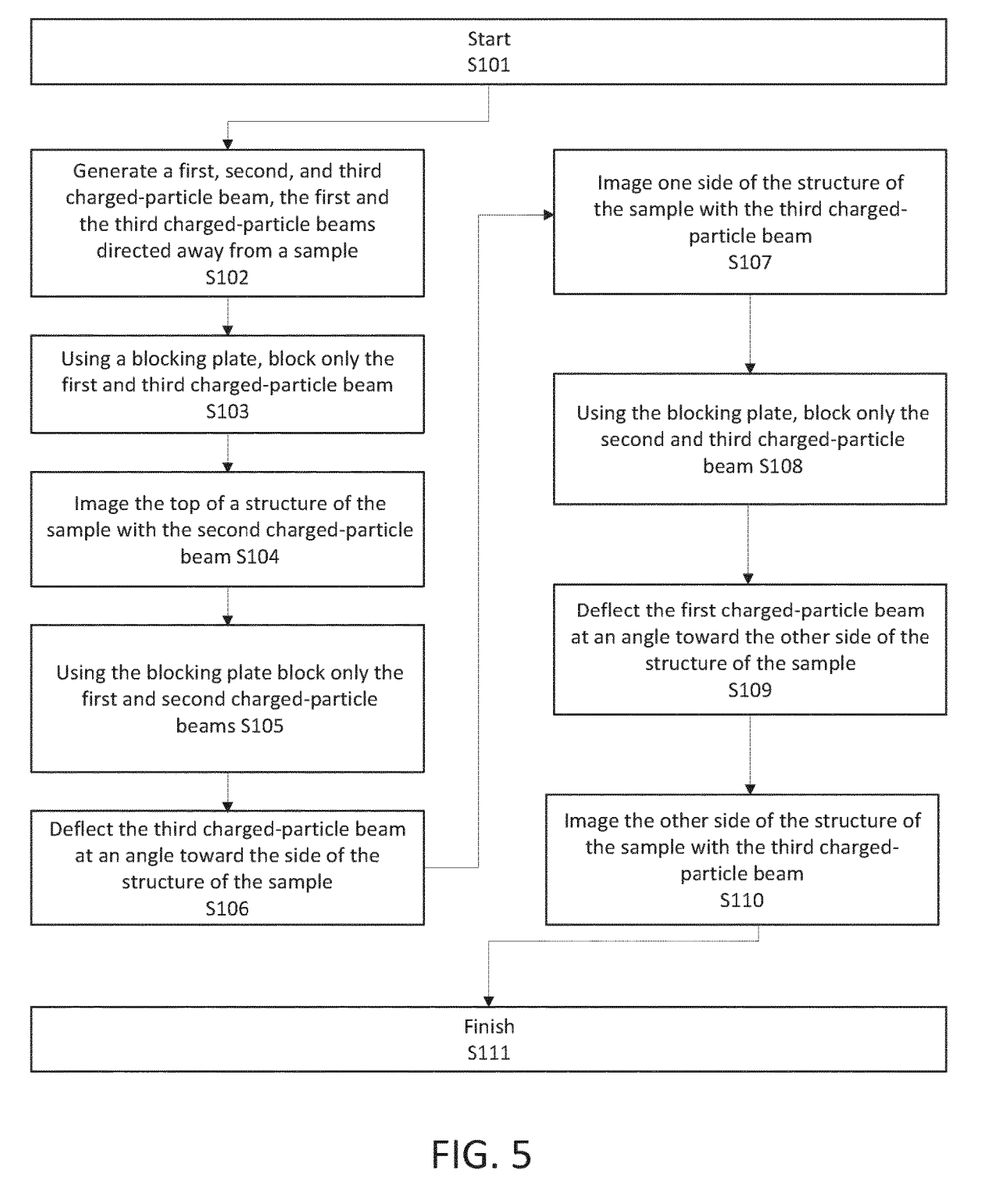
FIG. 5 is a process flow chart of an exemplary method of real-time stereo imaging using multiple electron beams, consistent with embodiments of the present disclosure.

Reference is now made to FIG. 5, which illustrates a flowchart of an exemplary method for real-time stereo imaging using multiple electron beams A controller (e.g. controller 50 of FIG. 1) may be programmed to implement one or more blocks of the flowchart of FIG. 5. The controller may be coupled with a charged-particle beam apparatus (e.g., EBI tool 100 of FIG. 2). The controller may control operations of the charged-particle beam apparatus.

In a step S101, the method can begin. At step S102, the charged-particle beam apparatus can generate a first, second, and third charged-particle beams (e.g., electron beams 303, 305, and 307 of FIGS. 3A-3C) using, for example, electron beam source 301 of FIGS. 3A-3C. The three charged-particle beams can be directed in different directions. In some embodiments, the three charged-particle beams are emitted parallel to each other. In some embodiments, the three charged-particle beams are generated independently of each other. In other embodiments, the three charged-particle beams can come from a single beam. In these embodiments, each single beam can be directed using a deflector to generate three beams, one of which can be active at any point in time.

In step S103, the method can use a blocking plate, e.g., blocking plate 320 of FIGS. 3A-3C, to block the first and third charged-particle beams. In embodiments where the three charged-particle beams are generated from a single particle beam and a deflector, as described above, only the second charged-particle beam can be active instead of requiring a blocking plate. Blocking the first and third charged-particle beams can produce a configuration like that shown in FIG. 3A where the second charged-particle beam (e.g., electron beam 305 of FIG. 3A) reaches the sample (e.g., sample 360 of FIG. 3A).

In step S104, the second charged-particle beam can image the top of the sample wafer. The second charged-particle beam (e.g., electron beam 305 of FIG. 3A) can pass through a condenser (e.g., condenser 330 of FIG. 3A) to focus the charged-particle beam on an objective lens (e.g., objective lens 340 of FIG. 3A) that can focus the charged-particle beam on the sample wafer. The image of the top of the sample wafer illuminated by the second charged-particle beam can be acquired by the charged-particle beam apparatus.

In step S105, after acquiring the image of the top of the sample wafer, the charged-particle beam apparatus can block the first and second charged-particle beams (e.g., electron beams 303 and 305 of FIG. 3B) and allow the third charged-particle beam (e.g., electron beam 307 of FIG. 3B) to pass as shown in the configuration of FIG. 3B. In some embodiment, the blocking plate (e.g., blocking plate 320 of FIG. 3B) can be repositioned to block the first and second charged-particle beams and to allow the third charged-particle beam to pass. In some embodiments, one or more deflectors (e.g., deflectors 313 and 315 of FIG. 3B) can deflect the first and second charged-particle beams into the blocking plate. The third charged-particle beam can be emitted at an angle away from sample wafer to a deflector (e.g., deflector 317 of FIG. 3B).

In step S106, a deflector (e.g., deflector 317 of FIG. 3B) can deflect the third charged-particle beam (e.g., electron beam 307 of FIG. 3B) at an angle toward the side walls of structures of the sample. The third charged-particle beam (e.g., electron beam 307 of FIG. 3B) can pass through a condenser (e.g., condenser 330 of FIG. 3B) to focus the charged-particle beam on an objective lens (e.g., objective lens 340 of FIG. 3B) that can focus the charged-particle beam on the sample. In some embodiments, the condenser lens can be repositioned and angled to be axially aligned with the third charged-particle beam. In other embodiments, a separate condenser lens from that used for the second charged-particle beam can be used. As explained earlier, the objective lens can be moveable as shown in FIGS. 3A-3C or fixed as shown in FIG. 4. For example, the objective lens can be positioned (e.g., by deflectors 350 of FIG. 3B) to reduce off-axis aberrations created by the intersection of the third charged-particle beam and the objective lens. In other embodiments (e.g., the embodiment of FIG. 4), a separate objective lens from that used for the second charged particle beam can be used that is axially aligned with the third charged particle beam to reduce any aberration. The image of the side walls of structures of the sample illuminated by the third charged-particle beam can be acquired by the charged-particle beam apparatus.

In step S107, the third charged particle beam can image the side walls of structures of the sample wafer. The third charged-particle beam (e.g., electron beam 307 of FIG. 3B) can be deflected by a deflector (e.g., deflector 317 of FIG. 3B) and pass through a condenser (e.g., condenser 330 of FIG. 3B) to focus the charged-particle beam on an objective lens (e.g., objective lens 340 of FIG. 3B) that can focus the charged-particle beam on the sample wafer. The image of the side walls of structures of the sample illuminated by the third charged-particle beam can be acquired by the charged-particle beam apparatus.

In step S108, after acquiring the image of the side walls of the structures of the sample, the charged-particle beam apparatus can block the second and third charged-particle beams (e.g., electron beams 305 and 307 of FIG. 3C) and allow the first charged-particle beam (e.g. electron beam 303) to pass as shown in the configuration shown in FIG. 3C, In some embodiments, the blocking plate (e.g., blocking plate 320 of FIG. 3C) can be repositioned to block the second and third charged-particle beams and can allow the first charged-particle beam to pass. In some embodiments, one or more deflectors (e.g., deflectors 315 and 317 of FIG. 3C) can deflect the first and second charged-particle beams into the blocking plate. The first charged-particle beam can be emitted at an angle away from the sample to a deflector (e.g., deflector 313 of FIG. 3C).

In step S109, a deflector (e.g., deflector 313 of FIG. 3C) can deflect the first charged-particle beam (e.g., electron beam 303 of FIG. 3F) at an angle toward the other side wall of structures of the sample that were not previously imaged. The first charged-particle beam (e.g., electron beam 303 of FIG. 3C) can pass through a condenser (e.g., condenser 330 of FIG. 3C) to focus the charged-particle beam on an objective lens (e.g., objective lens 340 of FIG. 3C) that can focus the charged-particle beam on the sample wafer. In some embodiments, the condenser can be repositioned and angled to be axially aligned with the first charged-particle beam. In other embodiments, a separate condenser lens from that used for the second and third charged-particle beam can be used. In some embodiments the objective lens can be positioned (e.g., by deflectors 350 of FIG. 3C) to reduce off-axis aberrations created by the intersection of the first charged-particle beam and the objective lens. In other embodiments a separate objective lens from that used for the second and third charged particle beam can be used that is axially aligned with the first charged particle beam to reduce any aberration. The image of the side wall of the structures of the sample wafer, not already imaged, illuminated by the first charged-particle beam can be acquired by the charged-particle beam apparatus.

In step S110, the first charged particle beam can image the other side wall of the structures of the sample. The first charged-particle beam (e.g., electron beam 303 of FIG. 3C) can be deflected by a deflector (e.g., deflector 313 of FIG. 3C) and pass through a condenser (e.g., condenser 330 of FIG. 3C) to focus the charged-particle beam on an objective lens (e.g., objective lens 340 of FIG. 3C) that can focus the charged-particle beam on the sample. The image of the side wall of the structures of the sample illuminated by the first charged-particle beam can be acquired by the charged-particle beam apparatus.

The process can end in step S111 and the charged particle beam apparatus (e.g., EBI tool 100 of FIG. 2) can construct a three-dimensional or stereo image of the sample using the image of the top and two sides of the structures of the sample. It is appreciated that the specific order in which the top and two sides of the structures of the sample are imaged is not important and can be done in any sequential order. The previously described process is one exemplary order for creating a three-dimensional or stereo image of sample wafer. It is also appreciated that reference in the present disclosure to structures of the sample can include both a single structure or multiple structures.

The embodiments may further be described using the following clauses:

1. A multi-beam apparatus configured to emit multiple charged-particle beams for imaging two sides of a structure of a sample, the apparatus comprising:

a deflector array including a first deflector and configured to receive a first charged-particle beam and a second charged-particle beam;

a blocking plate configured to block one of the first charged-particle beams and the second charged-particle beam; and a controller having circuitry and configured to change the configuration of the apparatus to transition between a first mode and a second mode, wherein:

in the first mode:
the deflector array is configured to deflect the second charged-particle beam to image a first side of the structure, and
the blocking plate is configured to block the first charged-particle beam, and in the second mode:
the first deflector is configured to deflect the first charged-particle beam to image a second side of the structure, and
the blocking plate is configured to block the second charged-particle beam.

2. A multi-beam apparatus configured to emit multiple charged-particle beams for imaging a top of and a side of a structure of a sample, the apparatus comprising:

a deflector array including a first deflector and configured to receive a first charged-particle beam and a second charged-particle beam;

a blocking plate configured to block one of the first charged-particle beams and the second charged-particle beam; and a controller having circuitry and configured to change the configuration of the apparatus to transition between a first mode and a second mode, wherein:

in the first mode:
the deflector array is configured to direct the second charged-particle beam to image the top of the structure, and
the blocking plate is configured to block the first charged-particle beam, and
in the second mode:
the first deflector is configured to deflect the first charged-particle beam to image the side of the structure, and
the blocking plate is configured to block the second charged-particle beam.

3. The apparatus of any one of clauses 1 and 2, further comprising an objective lens.

4. The apparatus of clause 3, wherein the objective lens is one of an electrostatic lens or a magnetic lens.

5. The apparatus of clause 3 wherein the objective lens is a combination of a magnetic lens and an electrostatic lens.

6. The apparatus of any one of clauses 3-5 wherein the objective lens is a moveable objective lens.

7. The apparatus of any one of clauses 2-6, wherein the direction of the second charged-particle beam by the deflector array includes a deflection of the second charged-particle beam.

8. The apparatus of any of clauses 1-7, further comprising a condenser lens.

9. The apparatus of clause 8, wherein the condenser lens is an electrostatic lens.

10. The apparatus of clause 8, wherein the condenser lens is a magnetic lens.

11. The apparatus of clause 8 wherein the condenser lens is a combination of a magnetic lens and an electrostatic lens.

12. The apparatus of any one of clauses 8-11 wherein the condenser lens is movable and rotatable to axially align with the first charged-particle beam or the second charged-particle beam.

13. The apparatus of any one of clauses 1-12 wherein each of the first charged-particle beam and second charged-particle beam are focused using separate objective lenses.

14. The apparatus of any one of clauses 1-13 wherein each of the first charged-particle beam and second charged-particle beam are focused using separate condenser lenses.

15. The apparatus of any one of clauses 1-14 wherein the deflector array includes a second deflector configured to deflect the second charged-particle beam into the blocking plate when operating the first mode.

16. The apparatus of any one of clauses 2-15, wherein the deflector array is configured to receive a third charged-particle beam and includes a third deflector configured to deflect the third charged-particle beam into the blocking plate when operating in either the first or second modes.

17. The apparatus of clause 15, wherein the controller is configured to change the configuration of the apparatus to transitions between the first mode, the second mode, and a third mode, wherein
in the third mode,
the third deflector is configured to direct the third charged-particle beam to image a second side different from the side of the structure, and
the blocking plate is configured to block the first and second charged-particle beams.

18. The apparatus of clause 1, wherein:
the deflector array is configured to receive a third charged-particle beam and includes a third deflector configured to deflect the third charged-particle beam into the blocking plate when operating in either the first or second modes; and
the controller is configured to change the configuration of the apparatus to transitions between the first mode, the second mode, and a third mode, wherein
in the third mode,
the third deflector is configured to direct the third charged-particle beam to image a top of the structure, and
the blocking plate is configured to block the first and second charged-particle beams.

19. The apparatus of any one of clauses 1-18, wherein the controller is further configured to: acquire an image from each portion of the structure;
combine the acquired images into a stereo image of the structure.

20. A method for imaging two sides of a structure of a sample using a charged-particle beam tool, the method comprising:
transitioning to a first mode, the transition comprising:
deflecting, using a deflector array, a second charged-particle beam to a first side of the structure;
blocking, using a blocking plate, the first charged-particle beam.
imaging the first side of the structure; and
transitioning to a second mode, the transition comprising:
deflecting, using a first deflector of the deflector array, the first charged-particle beam to a second side of the structure;
blocking, using the blocking plate, the second charged-particle beam; and
imaging the side of the structure.

21. A method for imaging a top of and a side of a structure of a sample using a charged-particle beam tool, the method comprising:
transitioning to a first mode, the transition comprising:
directing, using a deflector array, a second charged-particle beam to the top of the structure;
blocking, using a blocking plate, the first charged-particle beam.
imaging the top of the structure; and
transitioning to a second mode, the transition comprising:
deflecting, using a first deflector of the deflecting array, the first charged-particle beam to the side of the structure;
blocking, using the blocking plate, the second charged-particle beam; and
imaging the side of the structure.

22. The method of any one of clauses 20 and 21, further comprising:
focusing the second charged-particle beam on a portion of the structure using a condenser lens.

23. The method of any one of clauses 20-22, further comprising focusing the second charged-particle beam on a portion of the structure using an objective lens.

24. The method of any one of clauses 20-23, further comprising focusing the first charged-particle beam on a portion of the structure using a condenser lens.

25. The method of any one of clauses 20-24, further comprising focusing the second charged-particle beam on a portion of the sample using an objective lens.

26. The method of any one of clauses 20-25, further comprising moving the condensing lens to be aligned with the second charged-particle beam.

27. The method of any one of clauses 20-26, further comprising rotating the condensing lens to be axially aligned with the second charged-particle beam.

28. The method of any one of clauses 20-27, further comprising moving the condensing lens to be aligned with the first charged-particle beam.

29. The method of any one of clauses 20-25 and 28, further comprising rotating the condensing lens to be axially aligned with the first charged-particle beam.
30. The method of any one of clauses 20-29, further comprising moving the objective lens to be aligned with the second charged-particle beam.
31. The method of any one of clauses 20-30, further comprising moving the objective lens to be aligned with the first charged-particle beam.
32. The method of any one of clauses 20-31, wherein blocking the second charged-particle beam further comprises deflecting the second charged-particle beam to the blocking plate.
33. The method of any one of clauses 20-32, wherein blocking the first charged particle beam further comprises deflecting the first charged-particle beam to the blocking plate.
34. The method of any one of clauses 21-33, further comprising:
    transitioning to a third mode, the transition comprising:
    deflecting, using a deflector array, a third charged-particle beam to a second side of the structure;
    blocking, using a blocking plate, the first charged-particle beam and the second charged-particle beam;
    imaging the second side of the structure.
35. The method of clause 20, further comprising:
    transitioning to a third mode, the transition comprising:
    deflecting, using a deflector array, a third charged-particle beam to a top of the structure;
    blocking, using a blocking plate, the first charged-particle beam and the second charged-particle beam;
    imaging the top of the structure.
36. The method of any one of clauses 20-35, further comprising:
    combining images from imaging into a stereo image of the structure.
37. A non-transitory computer readable medium storing a set of instructions that is executable by one or more processors of a system to cause the system to perform a method comprising:
    transitioning to a first mode, the transition comprising:
    deflecting, using a deflector array, a second charged-particle beam to a first side of a structure of a sample;
    blocking, using a blocking plate, the first charged-particle beam.
    imaging the first side of the structure; and
    transitioning to a second mode, the transition comprising; and
    deflecting, using a first deflector of the deflector array, the first charged-particle beam to a second side of the structure;
    blocking, using the blocking plate, the second charged-particle beam; and
    imaging the second side of the structure.
38. A non-transitory computer readable medium storing a set of instructions that is executable by one or more processors of a system to cause the system to perform a method comprising:
    transitioning to a first mode, the transition comprising:
    directing, using a deflector array, a second charged-particle beam to a top of a structure of a sample;
    blocking, using a blocking plate, the first charged-particle beam.
    imaging the top of the structure; and
    transitioning to a second mode, the transition comprising; and
    deflecting, using a first deflector of the deflector array, the first charged-particle beam to a side of the structure;
    blocking, using the blocking plate, the second charged-particle beam; and
    imaging the side of the structure.
39. The computer readable medium of any one of clauses 37 and 38, wherein the set of instructions that is executable by one or more processors of a system to cause the system to further perform:
    focusing the second charged-particle beam on a portion of the structure using a condenser lens.
40. The computer readable medium of any one of clauses 37-39, wherein the set of instructions that is executable by one or more processors of a system to cause the system to further perform focusing the second charged-particle beam on a portion of the structure using an objective lens.
41. The computer readable medium of any one of clauses 37-40, wherein the set of instructions that is executable by one or more processors of a system to cause the system to further perform focusing the first charged-particle beam on a portion of the structure using a condenser lens.
42. The computer readable medium of any one of clauses 37-41, wherein the set of instructions that is executable by one or more processors of a system to cause the system to further perform focusing the second charged-particle beam on a portion of the structure using an objective lens.
43. The computer readable medium of any one of clauses 37-42, wherein the set of instructions that is executable by one or more processors of a system to cause the system to further perform moving the condensing lens to be aligned with the second charged-particle beam.
44. The computer readable medium of any one of clauses 37-43, wherein the set of instructions that is executable by one or more processors of a system to cause the system to further perform rotating the condensing lens to be axially aligned with the second charged-particle beam.
45. The computer readable medium of any one of clauses 37-44, wherein the set of instructions that is executable by one or more processors of a system to cause the system to further perform moving the condensing lens to be aligned with the first charged-particle beam.
46. The computer readable medium of any one of clauses 37-42 and 45, wherein the set of instructions that is executable by one or more processors of a system to cause the system to further perform rotating the condensing lens to be axially aligned with the first charged-particle beam.
47. The computer readable medium of any one of clauses 37-46, wherein the set of instructions that is executable by one or more processors of a system to cause the system to further perform moving the objective lens to be aligned with the second charged-particle beam.
48. The computer readable medium of any one of clauses 37-47, wherein the set of instructions that is executable by one or more processors of a system to cause the system to further perform moving the objective lens to be aligned with the first charged-particle beam.
49. The computer readable medium of any one of clauses 37-48, wherein blocking the second charged-particle beam further comprises deflecting the second charged-particle beam to the blocking plate.
50. The computer readable medium of any one of clauses 37-49, wherein blocking the first charged particle beam further comprises deflecting the first charged-particle beam to the blocking plate.

51. The computer readable medium of any one of clauses 38-50, wherein the set of instructions that is executable by one or more processors of a system to cause the system to further perform:
transitioning to a third mode, the transition comprising:
using a deflector array, deflect a third charged-particle beam to a second side of the structure;
using a blocking plate, blocking the first charged-particle beam and the second charged-particle beam;
imaging the second side of the structure.

52. The computer readable medium of clause 37, wherein the set of instructions that is executable by one or more processors of a system to cause the system to further perform:
transitioning to a third mode, the transition comprising:
using a deflector array, deflect a third charged-particle beam to a top of the structure;
using a blocking plate, blocking the first charged-particle beam and the second charged-particle beam;
imaging the top of the structure.

53. The computer readable medium of any one of clauses 37-52, wherein the set of instructions that is executable by one or more processors of a system to cause the system to further perform:
combining images from imaging into a stereo image of the structure.

54. A scanning electron microscope (SEM) system, comprising:
a charged particle source for providing charged particles to enable a plurality of beamlets, a first beamlet being an axial beam manipulated to impact a sample substantially perpendicularly;
a plurality of deflectors, wherein a subset of the deflectors are configured to deflect a subset of the beamlets to cause each of the subset of the beamlets to impact the sample at a tilt relative to the axial beam; and
a plurality of condensers, wherein each of a subset of the condensers has an axis tilted to coincide with a path of a different one of the subset of beamlets.

55. The SEM system of clause 54, wherein the sample includes one or more structures.

56. The SEM system of any one of clauses 54 and 55, wherein the first beamlet is further configured to, based on the impact with the sample, image the top of the one or more structures.

57. The SEM system of any one of clauses 54-56, wherein each of the subset of beamlets is further configured to, based on impact with the sample, image a side of the one or more structures.

58. The SEM system of any one of clauses 54-57, wherein the sample is a wafer and the one or more structures are components of an integrated circuit manufactured on the wafer.

59. The SEM system of any one of clauses 54-58, further comprising:
a Moving Objective Lens (MOL) that can be configured to shift the focusing field of the objective lens.

60. The SEM system of clause 59, wherein the MOL is configured to shift the focusing field of the objective lens to coincide, at different times, with each of the beamlets.

61. The SEM of any one of clauses 54-60, wherein the objective lens is one of an electrostatic lens, a magnetic lens, or both.

62. The SEM system of any one of clauses 54-61, wherein the first beamlet has a path that is straight and perpendicular to the sample.

63. The SEM system of any one of clauses 54-62, wherein each of the condensers is an electrostatic lens, a magnetic lens, or both.

64. The SEM system of any one of clauses 54-63, further comprising:
a controller having circuitry and configured to process images based on the plurality of beamlets to enable a real time display of a three dimensional representation of the sample.

65. The SEM system of any one of clauses 54-64, wherein each of the subset of deflectors is configured to deflect a different beamlet of the subset of beamlets to cause each beamlet of the subset of beamlets to impact the sample at a different tilt relative to the axial beam.

66. The SEM system of any one of clauses 54-65, further comprising a blocking mechanism configured to prevent all but one of the beamlets from impacting the sample.

67. The SEM system of any one of clauses 54-66, wherein the tilt relative to the axial beam is greater than or equal to three degrees.

68. The SEM system of any one of clauses 54-66, wherein the tilt relative to the axial beam is greater than or equal to five degrees.

A non-transitory computer readable medium may be provided that stores instructions for a processor that can be part of, for example EBI tool 100 of FIG. 2, to carry out thermal sensing, flow sensing, image inspection, image acquisition, stage positioning, beam focusing, electric field adjustment, cleaning, hardening, heat treatment, material removal, and polishing, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), cloud storage, a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A multi-beam apparatus configured to emit multiple charged-particle beams for imaging a top of and a side of a structure of a sample, the apparatus comprising:
    a deflector array including a first deflector and configured to receive a first charged-particle beam and a second charged-particle beam;
    a blocking plate configured to block one of the first charged-particle beam and the second charged-particle beam;
    a moveable objective lens; and
    a controller having circuitry and configured to change the configuration of the apparatus to transition between a first mode and a second mode, wherein:
        in the first mode:
            the deflector array is configured to direct the second charged-particle beam to image the top of the structure,
            the moveable objective lens is configured to be positioned at a first location to focus the second charged-particle beam onto the top of the structure, and
            the blocking plate is configured to block the first charged-particle beam, and
        in the second mode:
            the first deflector is configured to deflect the first charged-particle beam to image the side of the structure,
            the moveable objective lens is configured to be positioned at a second location different from the first location to focus the first charged-particle beam onto the side of the structure, and
            the blocking plate is configured to block the second charged-particle beam.

2. The apparatus of claim 1, wherein the objective lens is one of an electrostatic lens or a magnetic lens.

3. The apparatus of claim 1, wherein the objective lens is a combination of a magnetic lens and an electrostatic lens.

4. The apparatus of claim 1, further comprising a condenser lens.

5. The apparatus of claim 4, wherein the condenser lens is an electrostatic lens.

6. The apparatus of claim 4, wherein the condenser lens is a magnetic lens.

7. The apparatus of claim 4, wherein the condenser lens is a combination of a magnetic lens and an electrostatic lens.

8. The apparatus of claim 7, wherein the condenser lens is movable and rotatable to axially align with the first charged-particle beam or the second charged-particle beam.

9. The apparatus of claim 1, wherein each of the first charged-particle beam and the second charged-particle beam are focused using separate condenser lenses.

10. The apparatus of claim 1, wherein the deflector array includes a second deflector configured to deflect the second charged-particle beam into the blocking plate when operating in the first mode.

11. The apparatus of claim 1, wherein the deflector array is configured to receive a third charged-particle beam and includes a third deflector configured to deflect the third charged-particle beam into the blocking plate when operating in either the first mode or the second mode.

12. A non-transitory computer readable medium storing a set of instructions that is executable by one or more processors of a system to cause the system to perform a method comprising:
    transitioning to a first mode, the transition comprising:
        directing, using a deflector array, a second charged-particle beam to a top of a structure of a sample;
        moving an objective lens to a first location to focus the second charged-particle beam onto the top of the structure;
        blocking, using a blocking plate, a first charged-particle beam;
        imaging the top of the structure; and
    transitioning to a second mode, the transition comprising:
        deflecting, using a first deflector of the deflector array, the first charged-particle beam to a side of the structure;
        moving the objective lens to a second location different from the first location to focus the first charged-particle beam onto the side of the structure;
        blocking, using the blocking plate, the second charged-particle beam; and
        imaging the side of the structure.

13. The apparatus of claim 1, wherein the moveable objective lens is moveable in a lateral direction between the first location and the second location.

14. The non-transitory computer readable medium of claim 12, wherein moving the objective lens includes laterally moving the objective lens between the first location and the second location.

* * * * *